United States Patent [19]

Keltner et al.

[11] Patent Number: 5,090,212
[45] Date of Patent: Feb. 25, 1992

[54] CUTOFF SWITCH FOR REFRIGERANT CONTAINER

[75] Inventors: Robert L. Keltner, Scurry; Jim B. Ferguson, Arlington, both of Tex.

[73] Assignee: Technical Chemical Company, Dallas, Tex.

[21] Appl. No.: 628,219

[22] Filed: Dec. 17, 1990

[51] Int. Cl.⁵ .................. F25B 45/00; H01H 35/18
[52] U.S. Cl. .............................. 62/149; 62/188; 73/313; 200/84 C
[58] Field of Search ............. 62/149, 188; 137/412; 330/6; 200/84.6; 73/313; 307/309

[56] References Cited

U.S. PATENT DOCUMENTS 3,405,870 10/1968 DeForest .................. 307/309 X
4,361,835 11/1982 Nagy ............................. 73/313
4,771,804 9/1988 Morales ........................ 137/412

FOREIGN PATENT DOCUMENTS 0085359 8/1983 European Pat. Off. .......... 73/313

Primary Examiner—William E. Wayner
Attorney, Agent, or Firm—Johnson & Gibbs

[57] ABSTRACT

A cutoff switch for refrigerant recovery storage container will indicate when the storage container reaches a maximum safe level. The switch will disable the compressor to prevent further recovery of refrigerant. The switch is located in a sensor housing that couples to a magnet housing. The magnet housing mounts to the upper end of the storage container and connects with the float. A magnet will move vertically in response to movement of the float. At least one Hall Effect sensor mounts in the sensor housing. The Hall Effect sensor will sense the presence of the magnet and disable the compressor accordingly.

9 Claims, 3 Drawing Sheets

CUTOFF SWITCH FOR REFRIGERANT CONTAINER

BACKGROUND OF THE INVENTION

1. Field of the Invention

This invention relates in general to refrigerant recovery systems, and in particular to a switch assembly for connection to a refrigerant storage container to cut off the introduction of refrigerant into the storage container once a maximum level has been reached.

2. Description of the Prior Art

Refrigerant recovery systems are used to recover refrigerant from air conditioning systems such as in vehicles and in buildings. A refrigerant recovery system will prevent the release of the refrigerant into the atmosphere, which may lead to depletion of the Earth's ozone layer. Refrigerant recovery systems have an accumulator and a filter for receiving the refrigerant, separating liquids and filtering the refrigerant. A compressor will create suction to draw the refrigerant from the air conditioning system. The compressor output leads to a condenser, which condenses the refrigerant into a liquid. The liquid flows into a storage container. The refrigerant may be recycled out of the storage container and back through the filter system to further clean the refrigerant.

It is important to avoid overfilling the container. Overfilling the container may result in excessive pressure rupturing the container. This could cause leakage of the refrigerant into the atmosphere.

Switch assemblies are available for automatically disabling the compressor once the selected refrigerant level is reached. These switch assemblies include in some cases a float which locates in the storage container. As the float moves upward, linkage means will contact a relay switch to cut off the compressor. While these systems are workable, the mechanical contacting of the float assembly with the relay switch can lead to sticking and failure.

SUMMARY OF THE INVENTION

In this invention, the cutoff switch utilizes Hall Effect sensors. A magnet housing couples to the storage container. The magnet housing carries a magnet. A linkage extends between a float and a magnet for moving the magnet from an empty position to a maximum level position. The Hall Effect sensors are mounted next to the magnet chamber so that they will sense the presence of the magnet and provide an electrical indication when the magnet is in the maximum level position. A circuit detects the electrical indication and disables the compressor.

In the preferred embodiment, the electrical indication is provided when all of the Hall Effect sensors cease to conduct. Each Hall Effect sensor conducts so long as one polar field of the magnet is within its presence. When the opposite pole, however, passes the sensors, the sensors cease conducting. This indicates that the storage container has reached the maximum allowable limit.

DETAILED DESCRIPTION OF THE INVENTION

Figure 1:
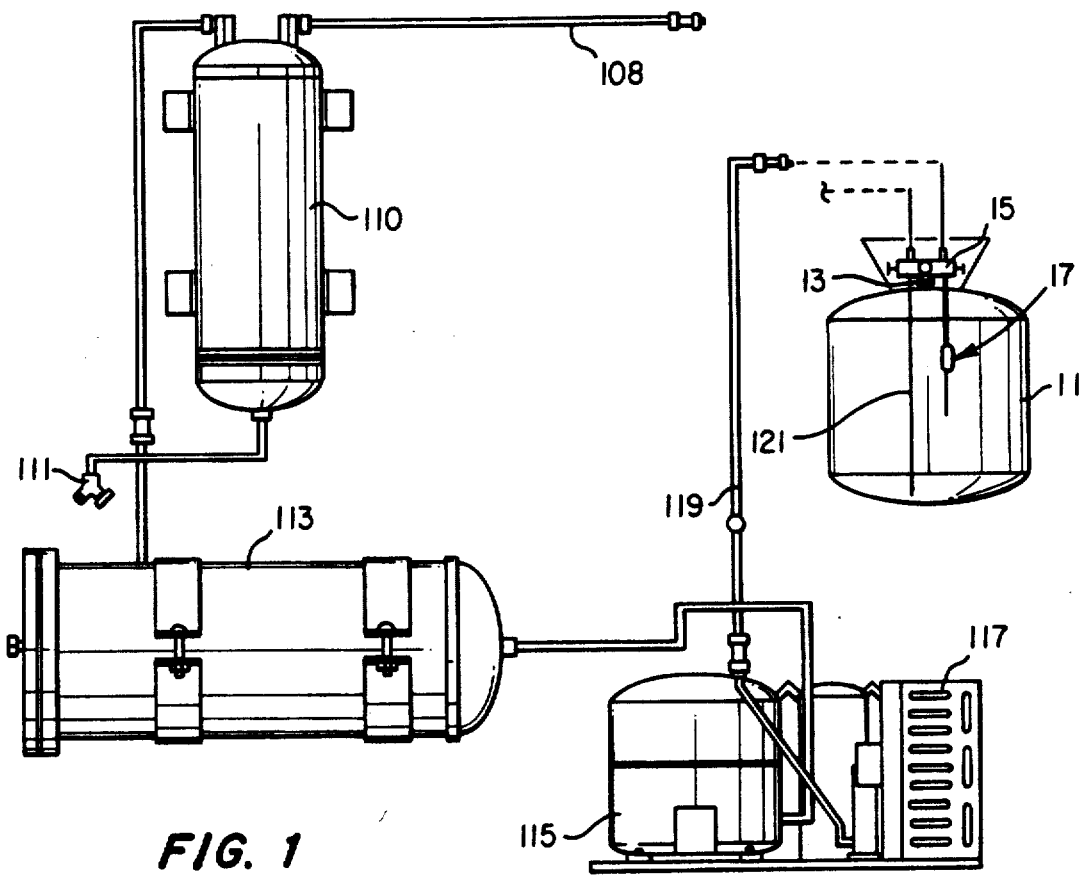
FIG. 1 is a schematic representation illustrating a refrigerant recovery system, having a cutoff switch constructed in accordance with this invention.

Referring to FIG. 1, refrigerant storage container 11 is conventional. It is a metal cylindrical container having a port 13 on its upper end. A valve assembly 15 will screw into the port 13. The valve assembly 15 has valves for introducing refrigerant as well as for allowing refrigerant to flow out of the storage container 11.

Figures 2, 4:
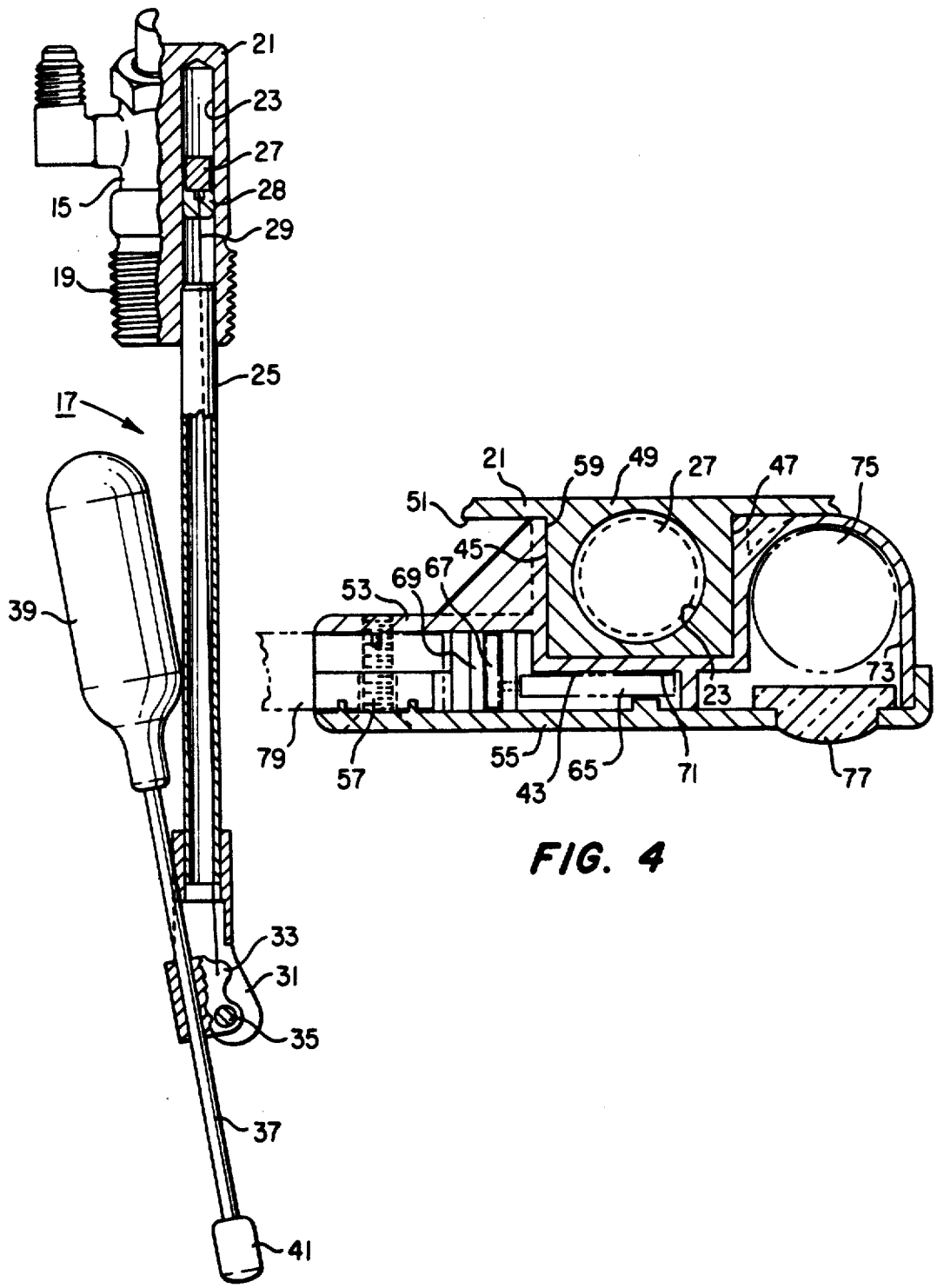
FIG. 2 is an enlarged partial sectional view of the float assembly and a portion of the cutoff switch assembly constructed in accordance with this invention.
FIG. 4 is a sectional view of the switch of FIG. 3, taken along the line IV—IV.

Referring to FIG. 2, valve assembly 15 has threads 19 at its lower end which serve as means for connecting the valve assembly 15 to storage container 11 (FIG. 1). The valve assembly 15 includes a magnet housing 21, which is part of the valve housing. Magnet housing 21 has a magnet chamber 23. Chamber 23 is a cylindrical passage formed along the longitudinal axis of the magnet housing 21. When installed, the magnet chamber 23 will be oriented with its longitudinal axis vertical.

A tube 25 extends downward from the magnet housing 21, concentric with the longitudinal axis of magnet chamber 23. Tube 25 is a rigid metal member that will insert into the storage container 11.

A magnet 27 will slide vertically within the magnet housing 21. Magnet 27 is a cylindrical member having a south pole field on its upper end and a north pole field on its lower end. Magnet 27 is mounted in a cylindrical carrier 28, which is connected to a rigid wire or rod 29.

Rod 29 extends downward through tube 25. A bracket 31 locates at the lower end of tube 25. A cam plate 33 pivotally mounts to bracket 31 by means of a pivot pin 35. Cam plate 33 will rotate back and forth about the axis of pin 35. The lower end of rod 29 connects to the cam plate 33.

A float rod 37 mounts rigidly to the cam plate 33 perpendicular to the axis of the pivot pin 35. A float 39 locates on one end of the float rod 37. A counter weight 41 locates on the other end of the float rod 37. Float 39 is a hollow member that will float upward as the level of liquid in the storage container 11 (FIG. 1) rises.

As float 39 moves upward, it will push the rod 29 upward, which in turn pushes the magnet 27 upward. When in the uppermost position, as shown in FIG. 2, the magnet 27 will be in a maximum refrigerant level position. When the float 39 drops downward, cam plate 33 rotates counterclockwise about pin 35, and the magnet 27 will move downward in magnet chamber 23 to an empty position.

Referring to FIG. 4, the magnet housing 21 has a generally rectangular exterior. It has a forward wall 43 that is flat, and two parallel side walls 45, 47. A back wall 49 that is parallel to forward wall 43 encloses the magnet chamber 23. Webs 51 extend laterally from each side wall 45, 47 in the same plane as the back wall 49.

Figure 3:
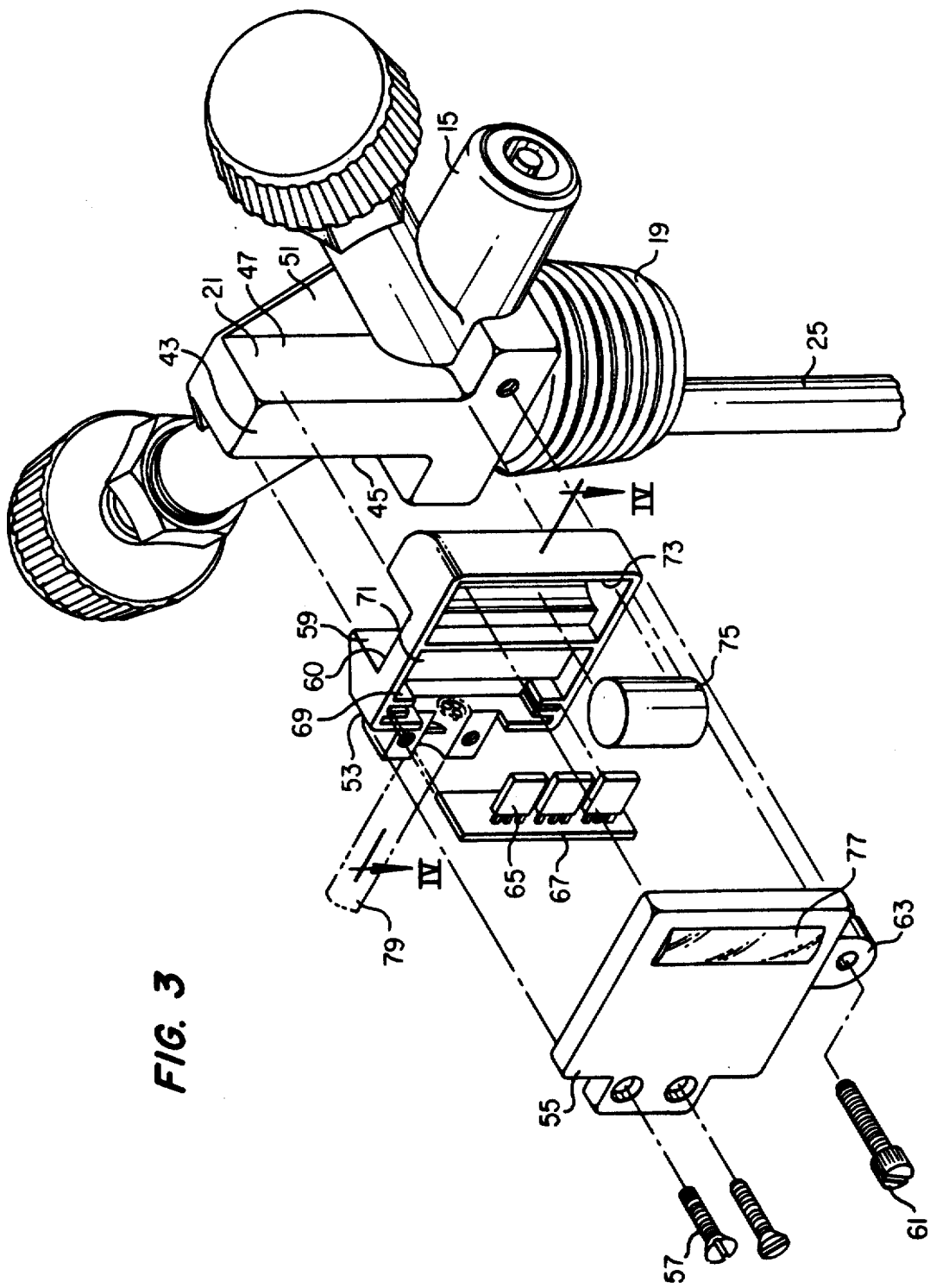
FIG. 3 is a perspective view of portions of the float assembly of FIG. 2, and showing additional portions of the cutoff switch in an exploded view.

Referring also to FIG. 3, a cutoff switch will mount to the magnet housing 21. The cutoff switch includes a sensor housing 53. Housing 53 has a front plate 55 that secures by screws 57 to the sensor housing 53. A longitudinal, rectangular slot 59 extends along the back wall of the sensor housing 53. Slot 59 is dimensioned to closely receive the magnet housing 21. FIG. 4 shows the sensor housing 53 mounted to the magnet housing 21. A screw 61 will extend through a flange 63 which depends from the front plate 55. Screw 61 secures to a hole in the valve assembly 15 to retain the sensor housing 53 with the magnet housing 21.

Three Hall Effect sensors 65 mount in the sensor housing 53. Each Hall Effect sensor 65 is a conventional sensor of a type that will sense the presence of a magnet. Each Hall Effect sensor 65 will conduct when the south pole of the magnet 27 is within range. Once sensing the north pole of the magnet 27, each Hall Effect sensor 65 will cease to conduct. Also, each Hall Effect sensor 65 will not conduct when the magnet 27 is completely out of range. This would occur when the sensor housing 53 is removed from the magnet housing 21.

Each Hall Effect sensor 65 is mounted to a single circuit board 67. The Hall Effect sensors 65 are located in a single vertical plane that is parallel to a back wall 71. The sensors 65 are spaced apart vertically and located in flush contact with the back wall 71. As shown in FIG. 4, this positioning places sensors 65 in close proximity to the magnet 27, but separated by the back wall 71 and forward wall 43. The circuit board 67 mounts to supports 69 located at the upper and lower ends of the sensor housing 53.

The sensor housing 53 also has an indicator chamber 73. Indicator chamber 73 is integrally formed with the sensor housing 53. It locates adjacent the back wall 71. The indicator chamber 73 extends longitudinally for receiving a metal indicator element 75. Indicator element 75 is also a magnet and is attracted to the magnet 27 (FIG. 4). Axial movement of magnet 27 will cause corresponding axial movement of indicator element 75.

A window 77 locates in front plate 55 to provide viewing of the indicator element 75. Indicia (not shown) may be placed on the front plate 55 to indicate the level of fullness. The indicator element 75 will move from the lower end to the upper end as the storage container 11 (FIG. 1) fills, and as the magnet 27 (FIG. 2) moves upward.

Figure 5:
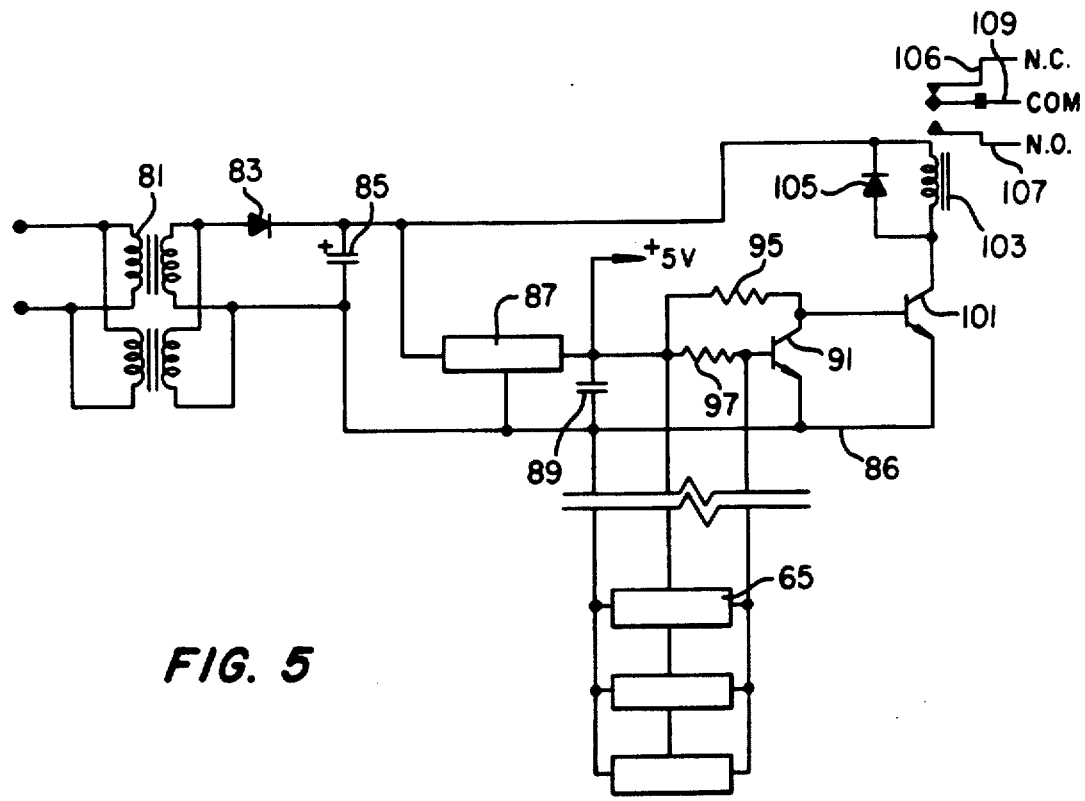
FIG. 5 is an electrical schematic illustrating the circuit utilized with the switch of FIG. 3.

Electrical cord 79 extends from one side of the sensor housing 53 to connect the circuit board 67 to the refrigerant recovery system. The circuit board 67 contains some of the circuitry illustrated in FIG. 5. A separate circuit board mounted in the recovery system includes a transformer 81. Transformer 81 converts the line voltage to 24 volts and provides isolation from the line. A diode 83 converts the 18 volt AC to pulsating DC. A capacitor 85 is connected to the diode 83 for filtering and smoothing the half-wave rectified AC to provide a constant source of DC. Capacitor 85 is connected between the diode 83 and a ground line 86. An integrated circuit 87 connects between the diode 83 and ground line 86. Integrated circuit 87 is a conventional device for regulating the voltage imposed across the capacitor 85 and to provide a steady source of five volts DC. A capacitor 89 provides for stability of integrated circuit 87, and is connected across the output and the ground line 86.

The Hall Effect sensors 65 are connected electrically in parallel with each other. Each has one leg connected to ground line 86 and another leg connected to the base of a transistor 91. Each Hall Effect sensor 65 also has another leg conventionally connected to the output of the integrated circuit 87.

When any one of the three Hall Effect sensors 65 is on, the base of the transistor 91 is pulled to the ground potential of ground line 86, causing the transistor 91 to cease conducting. The transistor 91 is conventionally connected, having a resistor 95 connected from its collector to the opposite end of a resistor 97, which connects to the base of the transistor 91.

The collector of transistor 91 connects to the base of a transistor 101. When transistor 91 ceases conducting, transistor 101 will conduct. This allows current to flow from integrated circuit 87 through resistor 95 to the base of transistor 101. Transistor 101 now acts as switch to allow current flow through the coil of a relay 103.

Relay 103 has two stationary contacts, one connected to a normally closed line 105, and the other connected to a normally open line 107. The relay 103 contacts will connect a movable common line 109 to the normally closed line 105 when current is not flowing. If current flows in the coil of relay 103, the resulting magnetic field will move the contacts. If current flows, the contact of the normally closed line 105 disconnects from connection with the common line 109. Diode 106, which is connected across the relay coil 103, is a protection device that absorbs the transient voltage spike that is generated by the collapse of the magnetic field in the coil 103 when current flow is interrupted.

Referring to FIG. 1, major components of a typical refrigerant recovery system are shown. These components include an intake line 108. Intake line 108 will connect to the refrigerant system for withdrawing the refrigerant. Intake line 108 leads to an accumulator 110. Accumulator 110 will trap oil. In addition, accumulator 110 will trap liquid refrigerant flowing through intake line 108. The liquid refrigerant will boil off into a gaseous refrigerant. An oil drain 111 allows oil captured from the refrigerant system to be drained.

The output of accumulator 110 leads to a filter dryer 113. The filter dryer 113 will remove water and impurities from the refrigerant. The output of filter dryer 113 leads to a compressor 115. The lines 105, 107, 109 (FIG. 5) are connected to the compressor 115 in a conventional manner for disabling the compressor from further operation if relay coil 103 is deenergized, which connects common line 109 to normally closed line 105. If relay coil 103 is energized, the contact of normally open line 107 with common line 109 enables the compressor 115 to operate.

Compressor 115 compresses the gaseous refrigerant and provides it to a condenser 117. Condenser 117 condenses the refrigerant, which passes through an output line 119 into the storage container 11. The storage container 11 will also have a recycle line 121 which is a part of the valve assembly 15 for withdrawing stored refrigerant. The refrigerant will recirculate in a recirculating path (not shown) through the filter dryer 113.

In operation, when the container 11 is less than its maximum level, the float 39 (FIG. 2) will be in a lower position. The magnet 27 will also be in a lower position within the magnet chamber 23. The magnet 27 will be located adjacent at least one of the Hall Effect sensors 65, when the container 11 is empty, and also when the container 11 is less than its desired maximum filled level. If any one of the three Hall Effect sensors 65 sense the south pole of the magnet 27, it will conduct. Consequently, as long as the container 11 is less than its maximum desired level, at least one of the sensors 65 will conduct.

When at least one of the sensors 65 conducts, the base of transistor 91 ceases to conduct. Current flows from integrated circuit 87 to the base of transistor 101, turning it on. Current will flow through the relay coil 103. This closes the contact of line 107 with line 109, enabling the compressor 115 to operate.

As the container 11 fills, the float 39 (FIG. 2) will move upward, pushing along with it the magnet 27. Eventually, the Hall Effect sensors 65 will become exposed to the north pole of the magnet. Once one of the Hall Effect sensors 65 is exposed to the north pole of the magnet, it will cease to conduct. Because the Hall Effect sensors 65 are electrically in parallel, the compressor 115 will continue operating. When all three of the Hall Effect sensors 65 are exposed to the north pole of the magnet, then all three cease to conduct.

The current that was flowing through resistor 97 now goes into the base of transistor 91, turning transistor 91 on. When transistor 91 turns on, the current that previously flowed into the base of transistor 101 now flows through transistor 91 to ground line 86. Transistor 101 now turns off. The current through relay coil 103 is interrupted. The relay contact 107 opens, and the normally closed line 105 will now contact the common line 109. This disables the compressor 115 from operating.

The Hall Effect sensors 65 are positioned so that all three will be exposed to the north pole of magnet 27 when the storage container is 80 percent full. Also, during upward movement of magnet 27, the indicator element 75 (FIG. 3) will move upward, indicating the level of fullness in the storage container 11.

The invention has significant advantages. The cutoff switch will disable the compressor from operating once the storage container reaches 80 percent capacity. The switch cannot be circumvented. If it is disconnected from the magnet housing, the Hall Effect sensors will not conduct, and will disable the compressor from operating. There are no mechanical contacts between the push rod and float which are subject to sticking.

While the invention has been shown in only one of its forms, it should be apparent to those skilled in the art that it is not so limited, but is susceptible to various changes without departing from the scope of the invention.

We claim:

1. In a refrigerant recovery apparatus of the type with a compressor having a suction line adapted to be connected to a refrigerant system for withdrawing refrigerant from the system and compressing the refrigerant, a condenser for condensing the compressed refrigerant, and a storage container for receiving the condensed refrigerant, an improved means for disabling the compressor when the storage container reaches a selected maximum level, comprising in combination:

float means located in the storage container for rising in the storage container as the level of refrigerant in the storage container rises;

a magnet housing having a longitudinal axis and coupled to the storage container;

a magnet carried in the magnet housing and movable axially relative to the magnet housing;

linkage means including a longitudinally movable link extending between the float means and the magnet for moving the magnet along the longitudinal axis from an empty position to a maximum level position in response to movement of the float means during filling of the storage container;

at least one Hall Effect sensor means for providing an electrical indication when the magnet is in the maximum level position;

means for coupling the Hall Effect sensor means to the magnet housing so that the Hall Effect sensor means may sense the presence of the magnet; and circuit means connected with the Hall Effect sensor means for detecting said electrical indication and for disabling the compressor when detecting said electrical indication.

2. The apparatus according to claim wherein the magnet housing locates on the exterior of the storage container.

3. In a refrigerant recovery apparatus of the type with a compressor having a suction line adapted to be connected to a refrigerant system for withdrawing refrigerant from the system and compressing the refrigerant, a condenser for condensing the compressed refrigerant, and a storage container having a port on its upper end for receiving the condensed refrigerant, an improved means for disabling the compressor when the storage container reaches a selected maximum level, comprising in combination:

a float assembly located in the storage container, having a float which rises in the storage container as the level of refrigerant in the storage container rises;

a magnet housing connected with the float assembly;

the magnet housing adapted to be coupled to the port of the storage container with the float assembly extending into the storage container, the magnet housing having a longitudinal axis that is vertical when coupled to the port of the storage container;

a magnet carried in the magnet housing and axially movable relative to the magnet housing, the magnet having two polar fields;

a link connected between the float assembly and the magnet which moves the magnet axially from an empty position to a maximum level position in response to movement of the float during filling of the storage container;

at least one Hall Effect sensor, the Hall Effect sensor electrically conducting when exposed to one polar field of the magnet, and blocking current flow when the magnet is out of range of the Hall Effect sensor and also when exposed to the other polar field of the magnet; and a circuit connected with the Hall effect sensor which determines when the Hall Effect sensor conducts and when the Hall Effect sensor blocks current flow, and for disabling the compressor when current flow is blocked, the Hall Effect sensor being located in the magnet housing in a position to conduct as the magnet moves from the empty position toward the maximum level position, and to block current flow when the magnet is in the maximum level position.

4. The apparatus according to claim 3 wherein the Hall Effect sensors are mounted in a sensor housing which releasably couples to the magnet housing.

5. The apparatus according to claim 3 wherein the Hall Effect sensor is exposed to one of the polar fields of the magnet when the magnet is in the maximum level position.

6. In a refrigerant recovery apparatus of the type with a compressor having a suction line adapted to be connected to a refrigerant system for withdrawing refrigerant from the system and compressing the refrigerant, a condenser for condensing the compressed refrigerant, and a storage container having a port on its upper end for receiving the condensed refrigerant, an improved means for disabling the compressor when the storage container reaches a selected maximum level, comprising in combination:

- a float assembly located in the storage container, having a float which rises in the storage container as the level of refrigerant in the storage container rises;
- a magnet housing connected with the float assembly, the magnet housing having a magnet chamber with a longitudinal axis;
- means for coupling the magnet housing to the port of the storage container with the float assembly extending into the storage container;
- a magnet carried in the magnet chamber and axially movable within the magnet chamber, the magnet having two polar fields;
- a rigid link connected between the float assembly and the magnet which moves the magnet axially from an empty position to a maximum level position in response to movement of the float during filling of the storage container;
- a plurality of Hall Effect sensors, each mounted electrically in parallel with each other;
- a sensor housing;
- means for mounting the Hall Effect sensors in the sensor housing axially spaced apart from each other;
- means for mounting the sensor housing to the magnet housing with the Hall Effect sensors adjacent the magnet chamber, each Hall Effect sensor being positioned to conduct as the magnet moves axially through the magnet chamber from the empty position toward the maximum level position, and to block current flow when the magnet is in the maximum level position; and
- circuit means connected with the Hall effect sensors for enabling the compressor as long as at least one of the Hall Effect sensors conducts, and for disabling the compressor when none of the Hall Effect sensors conducts, each Hall Effect sensor electrically conducting when exposed to one polar field of the magnet, and blocking current flow when the magnet is out of range of the Hall Effect sensor and also when exposed to the other polar filed of the magnet.

7. The apparatus according to claim 6 further comprising:
- an indicator chamber in the sensor housing, the indicator chamber having a window; and
- a ferrous metal indicator member carried in the indicator chamber for axial movement within the indicator chamber, the indicator chamber being positioned such that the magnet attracts the indicator member and causes it to move axially as the magnet moves axially, to indicate the level of refrigerant in the storage container.

8. The apparatus according to claim 6 wherein the magnet moves axially upward when the float rises.

9. The apparatus according to claim 6 wherein the magnet chamber protrudes from the magnet housing, and wherein the sensor housing has a longitudinal slot for closely receiving the magnet chamber.

* * * * *

UNITED STATES PATENT AND TRADEMARK OFFICE
CERTIFICATE OF CORRECTION

PATENT NO. : 5,090,212

DATED : February 25, 1992

INVENTOR(S) : Robert L. Keltner et al

It is certified that error appears in the above-indentified patent and that said Letters Patent is hereby corrected as shown below:

Column 6, line 11, after the word "claim" insert --1--.

Signed and Sealed this

First Day of March, 1994

Attest:

BRUCE LEHMAN

Attesting Officer    Commissioner of Patents and Trademarks